(12) United States Patent
Lee et al.

(10) Patent No.: US 6,998,894 B2
(45) Date of Patent: Feb. 14, 2006

(54) CURRENT CONTROLLED PULSE WIDTH MODULATION CIRCUIT AND CLASS-D AMPLIFIER COMPRISING THE SAME

(75) Inventors: Jong-Haeng Lee, Yongshi-shi (KR); Jeoung-In Lee, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/771,475

(22) Filed: Feb. 4, 2004

(65) Prior Publication Data
US 2004/0201407 A1 Oct. 14, 2004

(30) Foreign Application Priority Data
Feb. 4, 2003 (KR) ...................... 10-2003-0006875

(51) Int. Cl.
*H03K 3/84* (2006.01)
(52) U.S. Cl. ....................................... 327/172; 327/175
(58) Field of Classification Search ........ 327/172–176, 327/291, 165
See application file for complete search history.

(56) References Cited

U.S. PATENT DOCUMENTS

| | | | | |
|---|---|---|---|---|
| 3,875,929 A | * | 4/1975 | Grant | 600/429 |
| 5,498,989 A | * | 3/1996 | Diba | 327/230 |
| 5,907,254 A | * | 5/1999 | Chang | 327/165 |
| 6,707,320 B1 | * | 3/2004 | Trivedi et al. | 327/20 |
| 6,819,154 B1 | * | 11/2004 | Greenfeld | 327/172 |

* cited by examiner

*Primary Examiner*—Dinh T. Le
(74) *Attorney, Agent, or Firm*—F.Chau & Associates, LLC

(57) ABSTRACT

A pulse width modulation (PWM) circuit comprising an input circuit, first and second controllers, and first and second Schmidt triggers. The first controller sets a first voltage level by a first current generated responding to an input signal and an output of the input circuit. The first Schmidt trigger sets a first logic level when an output of the first controller reaches the first voltage level. The second controller sets a second voltage level by a second current generated responding to the input signal and an output of the first Schmidt trigger. The second Schmidt trigger generates a PWM output signal with a variable frequency in accordance with the first and second currents.

10 Claims, 8 Drawing Sheets

CURRENT CONTROLLED PULSE WIDTH MODULATION CIRCUIT AND CLASS-D AMPLIFIER COMPRISING THE SAME

BACKGROUND OF THE INVENTION

1. Technical Field

The present invention relates to integrated circuits and, more specifically, to current-controlled pulse width modulation (PWM) circuits and class-D amplifiers comprising the same.

2. Discussion of the Related Art

PWM is a circuit technique for carrying information by modulating a pulse width of a periodic signal. A typical circuit for generating a PWM signal employs a switching and/or control regulator. A PWM control regulator is used to vary pulse widths for operations with fixed frequencies and variable duty ratios. In addition, outputs from PWM circuits are usually employed to conduct switching operations of pass transistors having very small resistances.

Referring to FIG. 1, a conventional PWM circuit 100 includes a pyramidal wave generator 110, a first comparator 120, a low pass filter (LPF) 130, and a second comparator 140. The pyramidal wave generator 110 creates a signal with a pyramidal waveform and transfers it to the first comparator 120. The first comparator 120 generates a PWM output signal PWMOUT by comparing the output signal of the pyramidal wave generator 110 with an output signal of the second comparator 140. The second comparator 140 transfers an output, made by comparing an output of the LPF 130 with an audio signal, to the first comparator 120.

The PWM circuit 100 includes a feedback loop for the PWM output signal PWMOUT by way of the LPF 130. This feedback loop, however, may result in signal degradation as the PWM output signal PWMOUT passes through the LPF 130 or from noises induced by the LPF 130. Such noises may deteriorate the PWM output signal PWMOUT when short pulses of noise coincide with the signal as it passes through the LPF 130 or degrade the signal such that it is not observable. Furthermore, as the PWM output signal PWMOUT is formed (based on the output of the pyramidal wave generator 110), its frequency becomes fixed at a constant value that is typically lower than the frequencies required for systems using higher frequencies.

Therefore, there is a need for a PWM circuit that can generate a PWM output signal with a variable frequency.

SUMMARY OF THE INVENTION

It is, therefore, an object of the present invention to provide a current-controlled pulse width modulation (PWM) circuit capable of adjusting a duty ratio and a frequency of a PWM output signal in accordance with a dimension of an input signal. It is another object of the present invention to provide a class-D amplifier (employing the current-controlled PWM circuit) capable of providing an output with a constant signal-to-noise (S/N) ratio despite dimensional variations of an audio input signal.

According to an aspect of the present invention, there is provided a PWM circuit comprising: an input circuit receiving a PWM output signal; a first controller for generating an output of a first voltage level by a first current in response to an input signal and an output of the input circuit; a first Schmidt trigger for generating an output of a first logic level when the output of the first controller reaches the first voltage level; a second controller for generating an output of a second voltage level by a second current in response to the input signal and the output of the first Schmidt trigger; and a second Schmidt trigger for generating the PWM output signal whose frequency is variable in accordance with the first and second currents.

The first controller comprises: a first current converter for generating the first current from a power source voltage in response to a voltage level of the input signal; a transistor connecting the first current converter to a ground voltage in response to the output of the input circuit; and a capacitor being charged by the first current while being discharged by the transistor.

The second controller comprises: a second current converter for generating the second current from a power source voltage in response to an inverted voltage level of the input signal; a transistor connecting the second current converter to a ground voltage in response to the output of the Schmidt trigger; and a capacitor being charged by the second current while being discharged by the transistor.

The first and second current converters are PMOS transistors responding to the input signal. The first Schmidt trigger, being activated by an enable signal, outputs a high-leveled signal when the first voltage level of the first current conversion controller reaches a first trigger level and a low-leveled signal when the first voltage level of the first current conversion controller reaches a second trigger level and the second Schmidt trigger, being activated by an enable signal, outputs a high-leveled signal when the second voltage level of the second current conversion controller reaches a first trigger level and a low-leveled signal when the second voltage level of the second current conversion controller reaches a second trigger level.

In accordance with another aspect of the present invention, a PWM circuit is included in a class-D amplifier for generating an audio output signal from an audio input signal. The class-D amplifier also comprises; negative channel metal oxide semiconductor (NMOS) and positive channel metal oxide semiconductor (PMOS) transistors for responding to the PWM output signal; a loop filter for demodulating a signal driven by the NMOS and PMOS transistors; and a gain amplifier for generating the gain-amplified signal by amplifying an output of the loop filter. The loop filter comprises: a first resistor; an operational amplifier; and a resistor and a capacitor.

In accordance with yet another aspect of the present invention, a PWM circuit comprises: a first controller coupled to a first Schmidt trigger, wherein the first controller receives an input signal and an inverted output signal; and a second controller coupled to a second Schmidt trigger, wherein the second controller receives an inverted input signal and an output having a first logic level, wherein the second Schmidt trigger generates an output signal having a variable frequency.

BRIEF DESCRIPTION OF THE DRAWINGS

The above features of the present invention will become more apparent by describing in detail exemplary embodiments thereof with reference to the attached drawings, in which.

DESCRIPTION OF EXEMPLARY EMBODIMENTS

Figure 1:
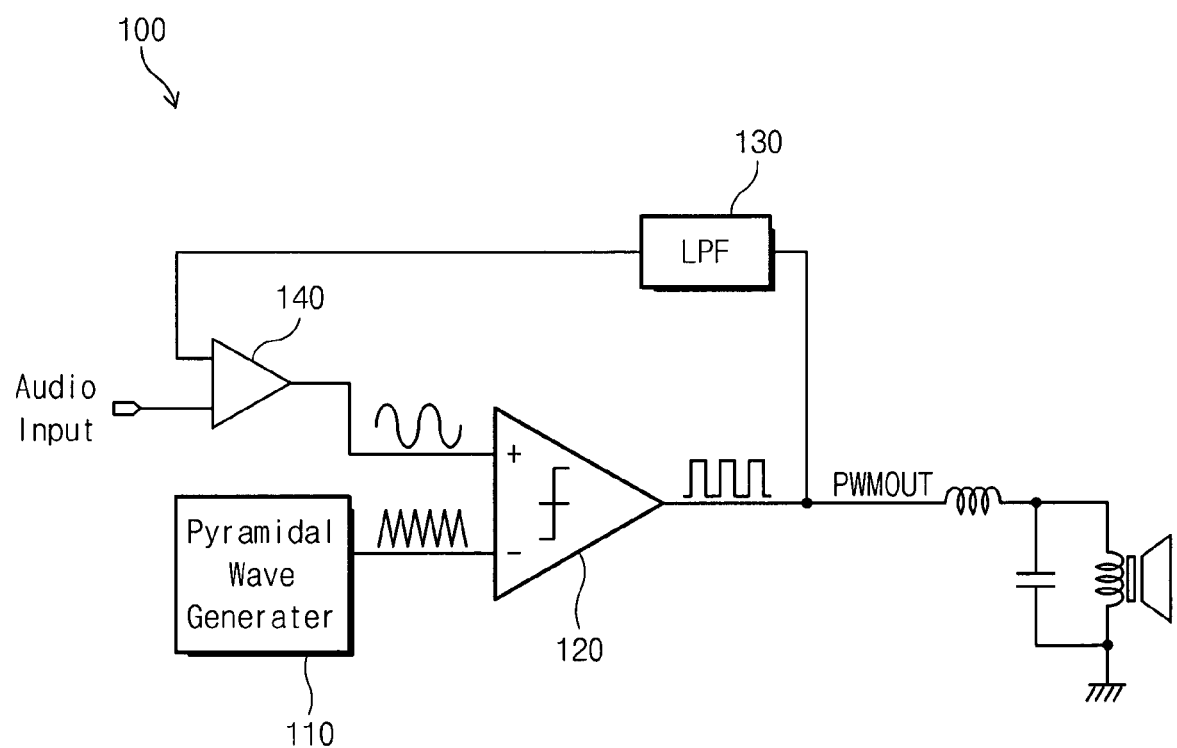
FIG. 1 is a circuit diagram of a conventional pulse width modulation (PWM) circuit.
Figure 2:
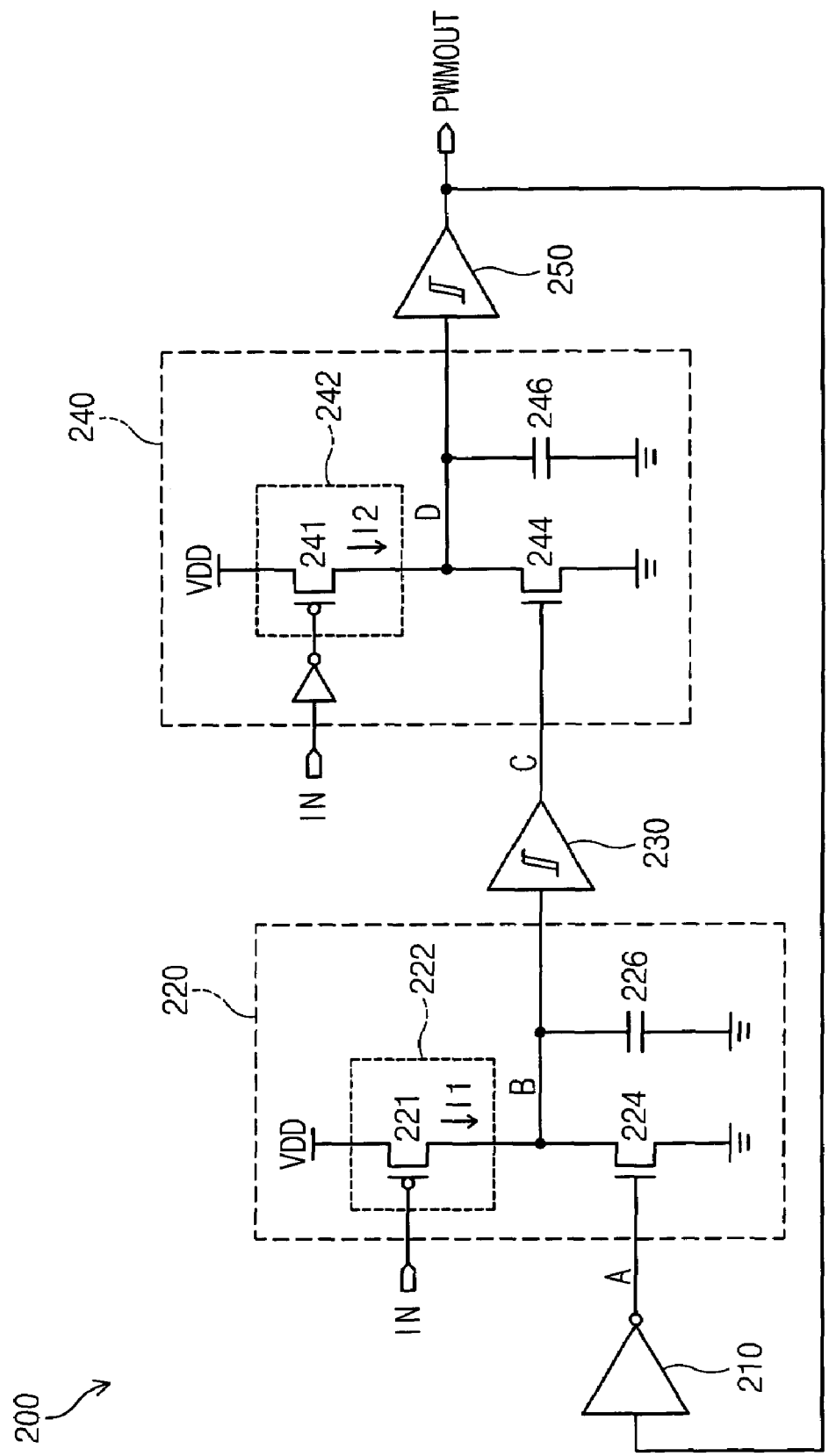
FIG. 2 is a circuit diagram of a PWM circuit according to an exemplary embodiment of the present invention.

Referring to FIG. 2, a current-controlled pulse width modulation (PWM) circuit 200 includes an input circuit 210, a current conversion controller 220, a Schmidt trigger 230, a current conversion controller 240, and a Schmidt trigger 250. The input circuit 210 is constructed of an inverter receiving a PWM output signal PWMOUT. The current conversion controller 220 is formed of a current converter 222 controlled by an audio input signal IN, a negative channel metal oxide semiconductor (NMOS) transistor 224 responding to an output of the input circuit 210 and connected between the current converter 222 and a ground voltage VSS, and a capacitor 226 coupled between the ground voltage VSS and a node B interposed between the current converter 222 and the NMOS transistor 224. The Schmidt trigger 230 generates an output that transitions to a logical voltage level when a voltage at the node B is over a predetermined voltage level. The current conversion controller 240 is constructed of a current converter 242 controlled by an inverted signal of the audio input signal IN, an NMOS transistor 244 connected between the current converter 242 and the ground voltage VSS and responding to the output of the Schmidt trigger 230, and a capacitor 246 coupled between the ground voltage VSS and a node D interposed between the current converter 242 and the NMOS transistor 244. The Schmidt trigger 250 generates the PWM output signal PWMOUT that transitions to a logical voltage level when a voltage at the node D is over a predetermined voltage level.

The current converters 222 and 242 set their outputs to a current (shown in FIG. 3) in response to a voltage level Vi of the audio input signal IN. The current converters 222 and 242 are constructed of positive channel metal oxide semiconductor (PMOS) transistors 221 and 241 controlled by the audio input signal IN and the inverted signal of the audio input signal IN, respectively. It is to be understood that the current converters 222 and 242 may be constructed with various configurations using sundry circuit elements such as NMOS transistors.

Figure 3:
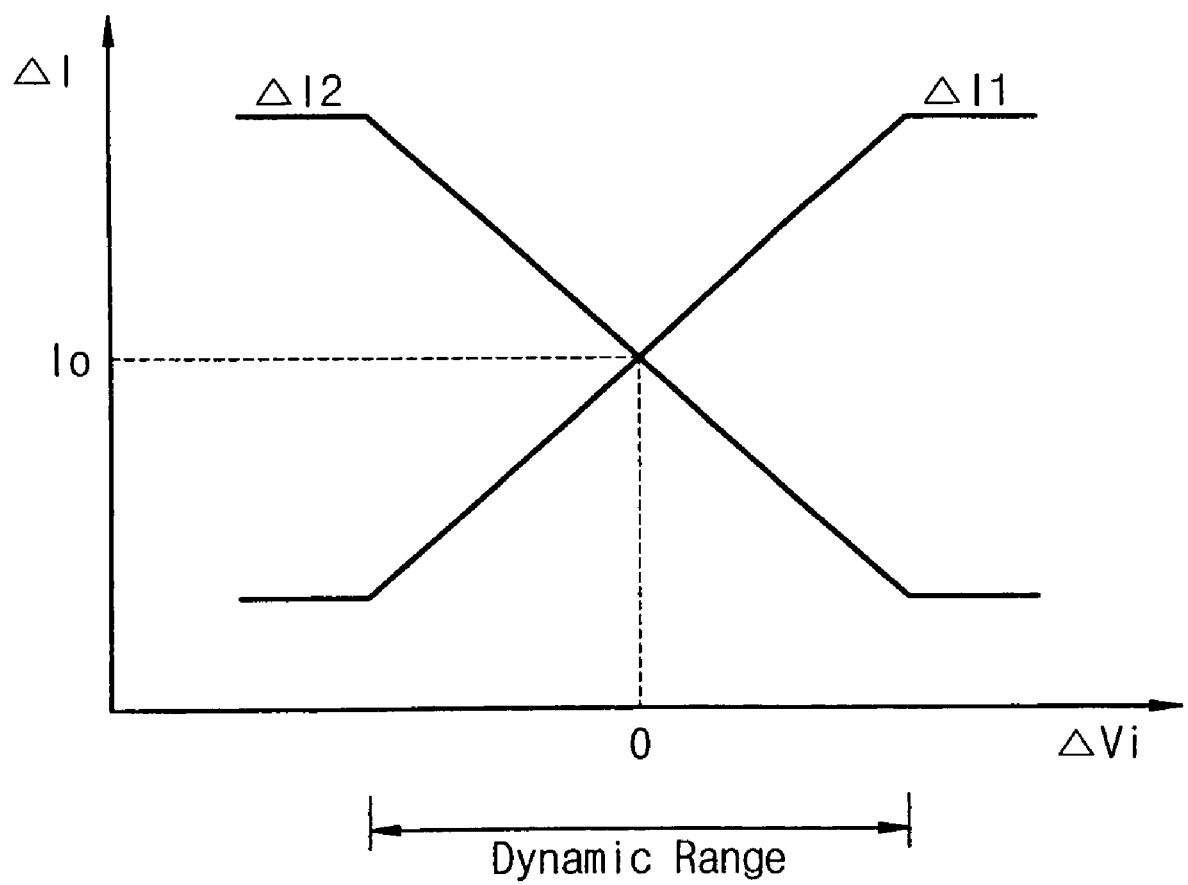
FIG. 3 is a graphic diagram characterizing an operation of a current converter shown in FIG. 2.

FIG. 3 shows output and/or operational characteristics of the current converters 222 and/or 242. Referring to FIG. 3, the current converters 222 and/or 242 are designed to operate in linear regions with the voltage level Vi of the audio input signal IN.

Figure 4:
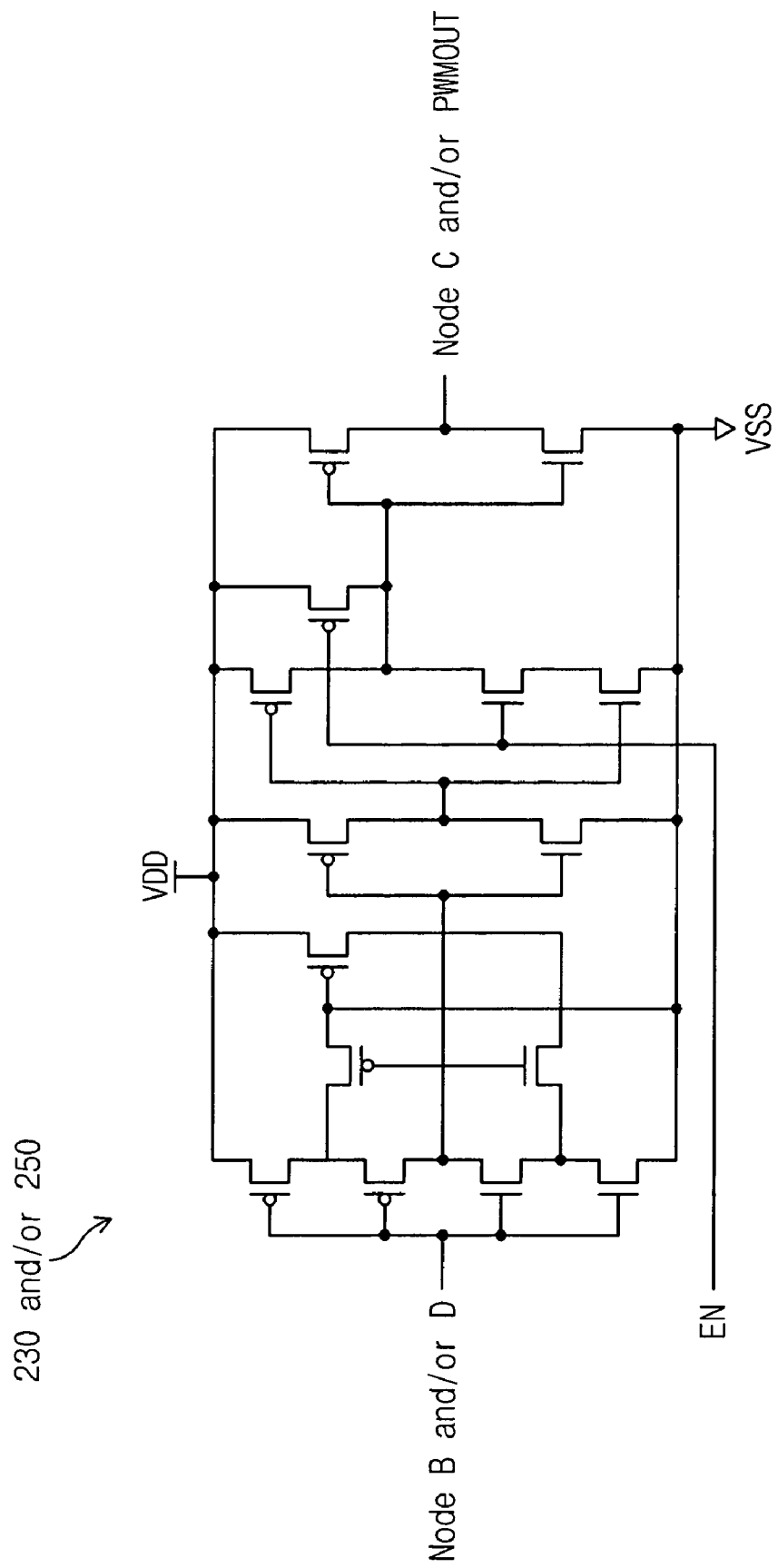
FIG. 4 is a circuit diagram of a Schmidt trigger shown in FIG. 2.

FIG. 4 illustrates a circuit diagram of the Schmidt triggers 230 and/or 250. Referring to FIG. 4, the Schmidt triggers 230 (and/or 250) generate an output voltage of a node C (and/or the PWM output signal PWMOUT) in response to a voltage level of the node B (and/or D), being controlled by an enable signal EN. The Schmidt triggers 230 and/or 250 enhance switching speeds by setting their triggering levels to high and low levels.

Figure 5:
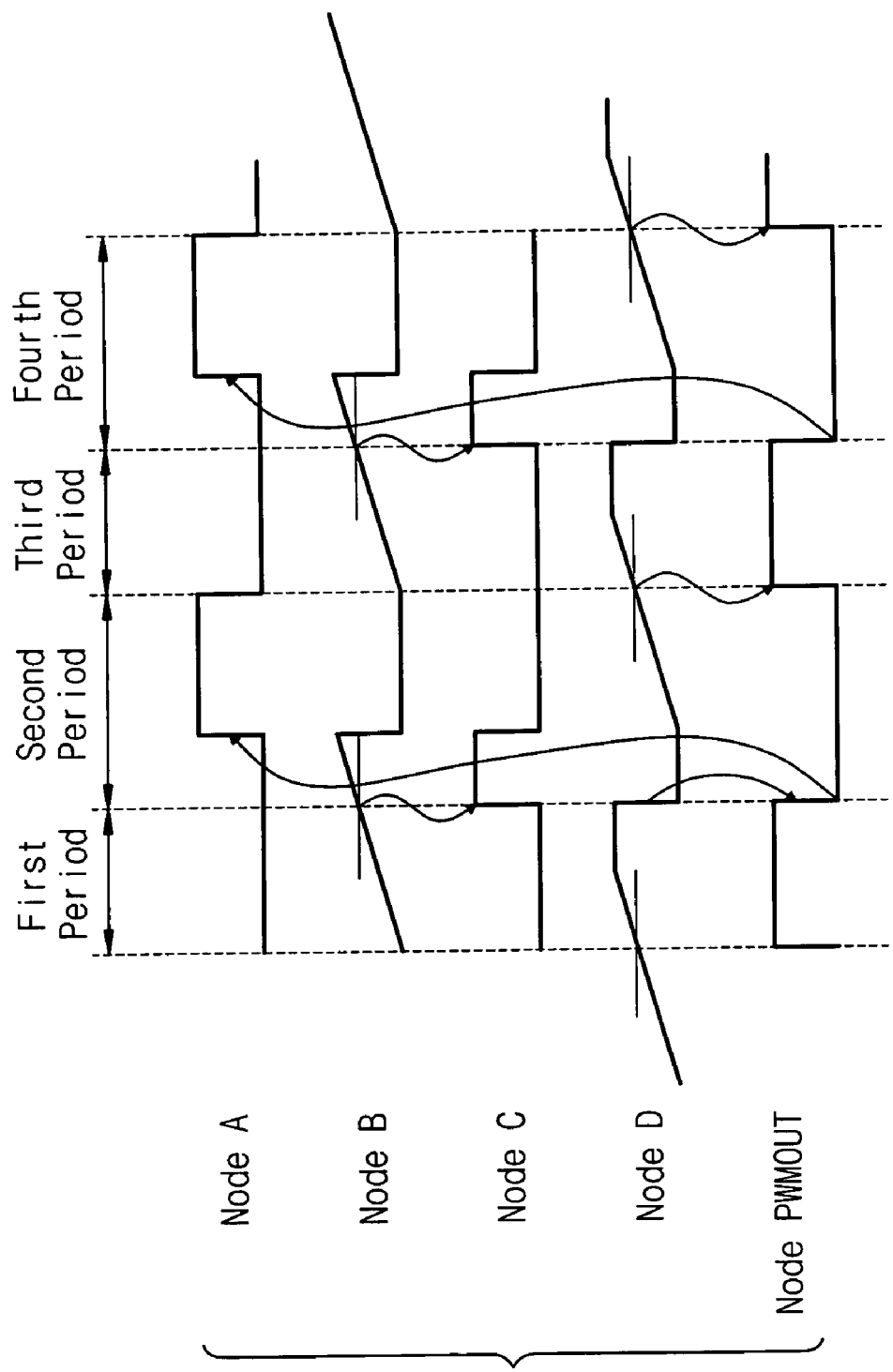
FIG. 5 is a timing diagram illustrating an operation of the PWM circuit shown in FIG. 2.

Referring to FIGS. 2 and 5, the current-controlled PWM circuit 200 sets the PWM output signal PWMOUT to a high level in response to the enable signal EN of a low level in the first period (e.g., a first time period). Thus, the node A goes to a low level to allow a current I1, which is supplied by the current converter 222 in the turn-on state of the NMOS transistor 224, to charge the node B to a higher voltage level.

When a voltage level at the node B rises over the trigger level of the Schmidt trigger 230 in the second period (e.g., a second time period), the node C goes to a high level. The node C of a high level turns the NMOS transistor 244 on and the node D is set to a low level. At this time, the PWM output signal PWMOUT goes to a low level and the node A is set to a high level. Responding to the high level of the node A, the NMOS transistor 224 is turned on and the nodes B and C go to low levels. Responding to the low-level of the node C, the NMOS transistor 244 is turned on to charge the capacitor 246 by a current I2 supplied by the current converter 242, so that a voltage level at the node D increases.

During the third period (e.g., a third time period), a voltage level of the node D becomes higher than the trigger voltage of the Schmidt trigger 250 and the PWM output signal PWMOUT is generated with a high level. Operations after the third period are iterated in accordance with the first and second periods as just described.

By observing a waveform of the PWM output signal PWMOUT, a high level interval is set by a charging time T1 of the capacitor 226, while a low level interval is set by a charging time T2 of the capacitor 246. The charging times T1 and T2 are established as follows.

$$T1 = \Delta I1/(C1 * \Delta V1)$$

$$T2 = \Delta I2/(C2 * \Delta V2)$$

Here, the terms C1 and C2 denote capacitance of the capacitors 226 and 246, respectively. $\Delta V1$ and $\Delta V2$ represent the trigger voltage variations of the Schmidt triggers 230 and 250, and $\Delta I1$ and $\Delta I2$ represent the current variations by the current converters 222 and 242, respectively.

Consequently, a frequency F of the PWM output signal PWMOUT may be obtained from $F = 1/(T1+T2)$.

Figure 6:
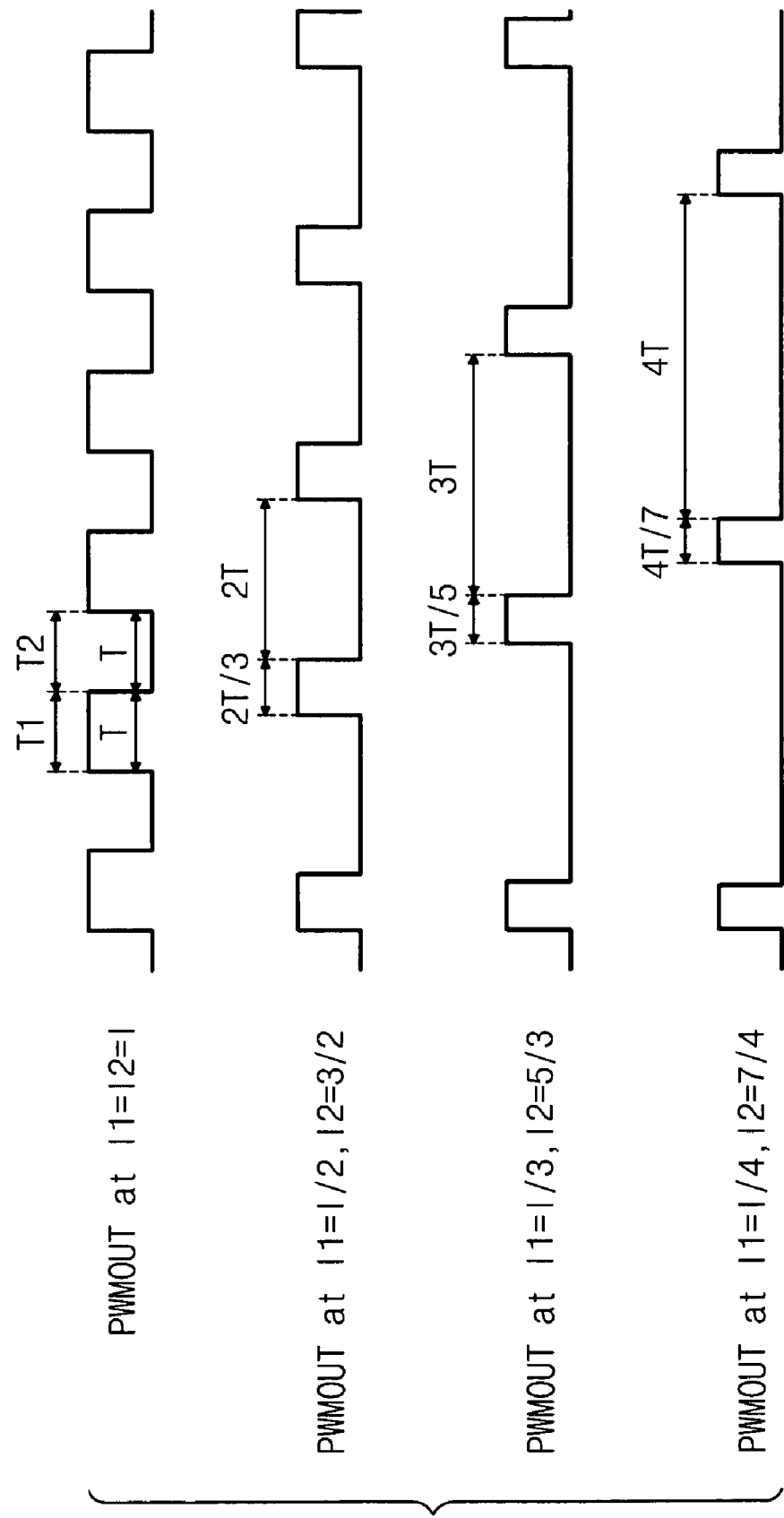
FIG. 6 illustrates frequency variations of a PWM output signal.

Therefore, the frequency of the PWM output signal PWMOUT can be adjusted by varying the conversion currents I1 and I2 of the current converters 222 and 242, as depicted in FIG. 6.

Referring to FIG. 6, a duty ratio (e.g., a time ratio of on and off intervals) of the PWM output signal PWMOUT is set to 50:50 when the first conversion current I1 is equal to the second conversion current I2. As such, the duty ratio of the PWM output signal PWMOUT is modified in accordance with a ratio between the first and second conversion currents, I1 and I2, in which: 1/2:3/2 of I1:I2 sets the duty ratio to 1:3; 1/3:5/3 to 1:5; and 1/4:7/4 to 1:7. The current ratio between I1 and I2 also varies the frequency of the PWM output signal PWMOUT.

Figure 7:
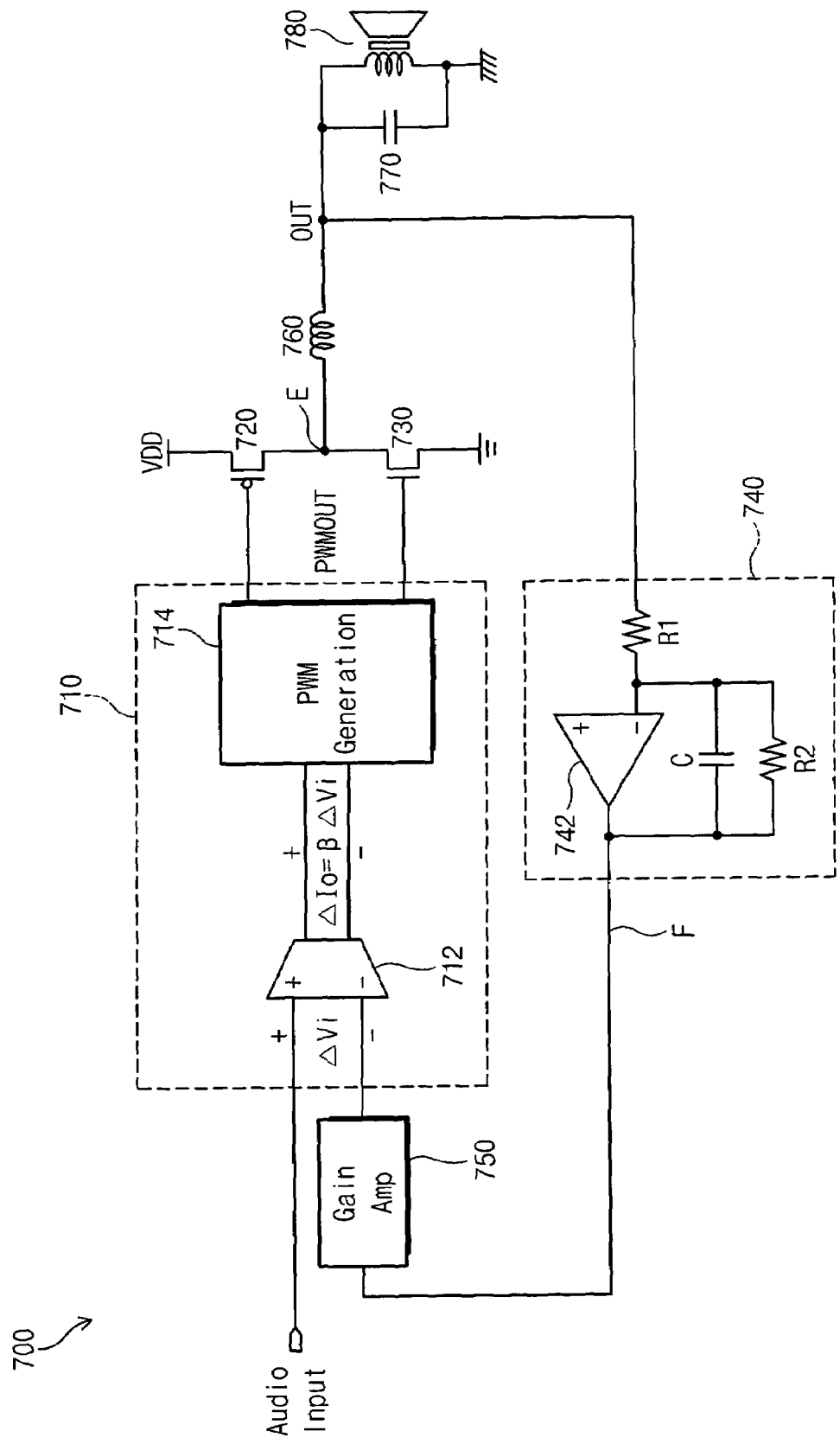
FIG. 7 is a circuit diagram of a class-D amplifier employing a PWM circuit in accordance with an exemplary embodiment of the present invention.

FIG. 7 illustrates a circuit diagram of a class-D amplifier 700 employing a current-controlled PWM circuit 710 in accordance with an exemplary embodiment of the present invention. The class-D amplifier 700 (e.g., a digital audio amplifier adaptable to function in portable electronic device such as mobile phones) is comprised of the current-controlled PWM circuit 710, a PMOS transistor 720, an NMOS transistor 730, a loop filter 740, a gain amplifier 750, an inductor 760, a capacitor 770, and a speaker 780. An audio input signal, which is input to the current-controlled PWM circuit 710, is magnified by the class-D amplifier 700 and output through the speaker 780. A current converter 712, which receives the audio input signal, generates a current from a voltage difference Δ Vi between the audio input signal and an output of the gain amplifier 750. The current converter 712 and PWM generation circuit 714 are similar to those of the current-controlled PWM circuit 200 shown in FIG. 2. Therefore, the current-controlled PWM circuit 710 generates the PWM output signal PWMOUT whose frequency is inversely proportional to amplitude the audio input signal, in other words, the frequency increases as the amplitude decreases while the frequency decreases as the amplitude increases.

The PMOS and NMOS transistors, 720 and 730, respond to an output of the current-controlled PWM circuit 710 to set the voltage level of a signal at a node E interposed between the transistors 720 and 730. The node E is connected to the loop filter 740 through the inductor 760. A signal passing through the inductor 760 becomes an audio output signal OUT that is applied to the speaker 780. The audio output signal OUT is also led to an input of the gain amplifier 750 through the loop filter 740, which composes a feedback loop for the audio output signal OUT. The loop filter 740 includes a resistor R1 connected to the inductor 760, an operational amplifier 742 with an inverted input terminal connected to the resistor R1, a capacitor C and a resistor R2 which are connected in parallel between the inverted input terminal and an output terminal of the operational amplifier 742. A non-inverted input terminal of the operational amplifier 742 is grounded. The loop filter 740 employs a resistor-capacitor (RC) filter, rather than an inductor-capacitor (LC) filter of high selectivity, to keep a (S/N) ratio at a constant level. As a result, the loop filter 740 may be fabricated in a smaller size without an inductor. The audio output signal OUT produced by the PWM output signal PWMOUT is demodulated by the loop filter 740. An output F (i.e., a demodulated signal) of the loop filter 740 is amplified to approximate the audio input signal level by the gain amplifier 750. The output of the gain amplifier 750 is then reapplied to the current-controlled PWM circuit 710. As a result, the feedback operation using pulse modulation and demodulation stabilizes a signaling pattern of the audio output signal.

Figure 8:
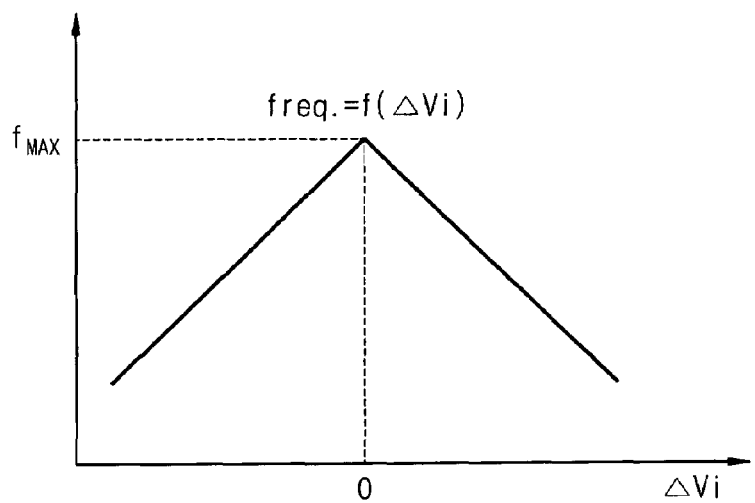
FIG. 8 is a graphic diagram characterizing an operation of the class-D amplifier shown in FIG. 7.
Figure 9:
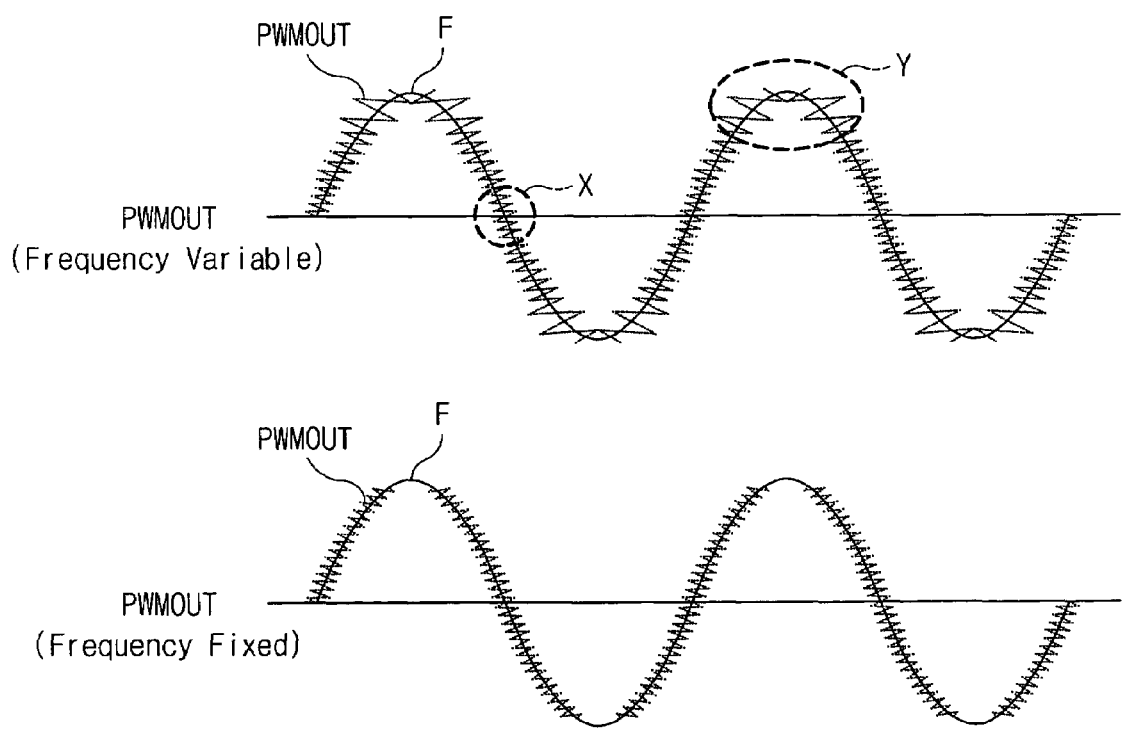
FIG. 9 illustrates signal-to-noise (S/N) ratios between a PWM output signal and a demodulated signal.

Operational characteristics of the class-D amplifier 700 are represented by FIGS. 8 and 9. Referring to FIG. 8, the frequency of the PWM output signal PWMOUT arrives at the maximum value $f_{max}$ when the voltage difference Δ Vi between the audio input signal and the output of the gain amplifier 750 is zero.

FIG. 9 illustrates a pattern of a (S/N) ratio between the demodulated signal F (i.e., the output of loop filter 740) and the PWM output signal PWMOUT. As shown in FIG. 9, using a variable, frequency PWM output signal PWMOUT as shown in FIG. 6, a noise level of the PWM output signal PWMOUT becomes lower as the demodulated signal level is smaller (e.g., at a region X). This decreases an attenuation rate of the demodulated signal F. A larger level of the demodulated signal F, which is shown at a region Y, enlarges a noise level therein. This increases an attenuation rate of the demodulated signal OUT because the PWM output signal PWMOUT oscillates at a low frequency.

Therefore, the (S/N) ratio remains constant in spite of an output level of the demodulated signal OUT due to the proportional correlation between the dimension of the demodulated signal OUT and the noise level on the PWM output signal PWMOUT.

Although exemplary embodiments of the present invention have been disclosed for illustrative purposes, those skilled in the art will appreciate that various modifications, additions and substitutions are possible, without departing from the scope and spirit of the invention as described in the accompanying claims and their equivalents.

What is claimed is:

1. A pulse width modulation (PWM) circuit comprising:
   an input circuit receiving a PWM output signal;
   a first controller for generating an output of a first voltage level by a first current in response to an input signal and an output of the input circuit;
   a first Schmidt trigger for generating an output of a first logic level when the output of the first controller reaches the first voltage level, wherein the first Schmidt trigger is electrically connected to the first controller;
   a second controller for generating an output of a second voltage level by a second current in response to the input signal and the output of the first Schmidt trigger; and
   a second Schmidt trigger for generating the PWM output signal whose frequency is variable in accordance with the first and second currents, wherein the second Schmidt trigger is electrically connected to the second controller.

2. The PWM circuit according to claim 1, wherein the first controller comprises:
   a first current converter for generating the first current from a power source voltage in response to a voltage level of the input signal;
   a transistor connecting the first current converter to a ground voltage in response to the output of the input circuit; and
   a capacitor being charged by the first current while being discharged by the transistor.

3. The PWM according to claim 2, wherein the first current converter is a positive channel metal oxide semiconductor (PMOS) transistor responding to the input signal.

4. The PWM circuit according to claim 1, wherein the second controller comprises:
   a second current converter for generating the second current from a power source voltage in response to an inverted voltage level of the input signal;
   a transistor connecting the second current converter to a ground voltage in response to the output of the first Schmidt trigger; and
   a capacitor being charged by the second current while being discharged by the transistor.

5. The PWM circuit according to claim 4, wherein the second current converter is a PMOS transistor responding to the input signal.

6. The PWM circuit according to claim 1, wherein the first Schmidt trigger, being activated by an enable signal, outputs a high-leveled signal when the first voltage level of the first controller reaches a first trigger level and a low-leveled signal when the first voltage level of the first controller reaches a second trigger level.

7. The PWM circuit according to claim 1, wherein the second Schmidt trigger, being activated by an enable signal, outputs a high-leveled signal when the second voltage level of the second controller reaches a first trigger level and a low-leveled signal when the second voltage level of the second controller reaches a second trigger level.

8. A pulse width modulation (PWM) circuit comprising:
   a first controller coupled to a first Schmidt trigger, wherein the first controller receives an input signal and an inverted output signal of an output signal having a variable frequency; and a second controller coupled to the first Schmidt trigger and a second Schmidt trigger, wherein the second controller receives an inverted signal of the input signal and an output having a first logic level, wherein the second Schmidt trigger generates the output signal having a variable frequency.

9. The PWM circuit according to claim 8, wherein the output signal having a variable frequency is generated by a first current of the first controller and a second current of the second controller.

10. The PWM circuit according to claim 8, wherein the output signal having a variable frequency is transmitted to an input circuit that outputs it to the first controller as the inverted output signal.

* * * * *